United States Patent
Kang et al.

(10) Patent No.: US 7,394,249 B2
(45) Date of Patent: Jul. 1, 2008

(54) PRINTED CIRCUIT BOARD WITH WEAK MAGNETIC FIELD SENSOR

(75) Inventors: Myung-Sam Kang, Daejeon (KR); Chang-Sup Ryu, Daejeon (KR); Won-Cheol Bae, Kyunggi-Do (KR); Jae-Kul Lee, Seoul (KR); Doo-Hwan Lee, Incheon (KR)

(73) Assignee: Samsung Electro-Mechanics Co., Ltd, Kyunggi-Do (KR)

( * ) Notice: Subject to any disclaimer, the term of this patent is extended or adjusted under 35 U.S.C. 154(b) by 586 days.

(21) Appl. No.: 10/965,613

(22) Filed: Oct. 14, 2004

(65) Prior Publication Data

US 2006/0001422 A1    Jan. 5, 2006

(30) Foreign Application Priority Data

Jul. 5, 2004    (KR) .................... 10-2004-0052112

(51) Int. Cl.
*G01R 33/04* (2006.01)
(52) U.S. Cl. ...................... 324/253; 324/249
(58) Field of Classification Search .......... 324/244–260
See application file for complete search history.

(56) References Cited

U.S. PATENT DOCUMENTS

| | | | |
|---|---|---|---|
| 5,936,403 A | 8/1999 | Tamura | |
| 6,270,686 B1 | 8/2001 | Tamura | |
| 6,753,682 B2 * | 6/2004 | Kang et al. | 324/253 |
| 6,759,845 B2 * | 7/2004 | Kang et al. | 324/253 |

FOREIGN PATENT DOCUMENTS

| KR | 2000-07791 | 2/2000 |
|---|---|---|
| KR | 2004-11287 | 2/2004 |

\* cited by examiner

*Primary Examiner*—Jay M Patidar
(74) *Attorney, Agent, or Firm*—Gottlieb, Rackman & Reisman, P.C.

(57) ABSTRACT

Disclosed is a printed circuit board with a weak magnetic field sensor according to the present invention, which includes a substrate having first excitation circuits and first detection circuits formed on both sides thereof. First laminates are layered on both sides of the substrate, and have soft magnetic cores with a predetermined shape formed thereon. Second laminates are layered on the first laminates, and have second excitation circuits and second detection circuits, connected through via holes to the first excitation circuits and first detection circuits, respectively, so that the first and second excitation circuits and first and second detection circuits are wound around the soft magnetic cores, formed thereon. The soft magnetic cores each include a magnetic core and non-magnetic metal layers formed on both sides of the magnetic core.

9 Claims, 10 Drawing Sheets

PRINTED CIRCUIT BOARD WITH WEAK MAGNETIC FIELD SENSOR

BACKGROUND OF THE INVENTION

1. Field of the Invention

The present invention relates, in general, to a printed circuit board with a weak magnetic field sensor and a method of fabricating the same and, more particularly, to a printed circuit board with a weak magnetic field sensor, in which a soft magnetic core, an excitation circuit, and a detection circuit lie at right angles to each other on upper and lower sides of the printed circuit board to sense a weak-magnetic field having a similar strength to the earth's magnetic field, and a method of fabricating the same.

2. Description of the Prior Art

The recent trend of expansion of various kinds of additional information services associated with the spread of mobile phones and mobile terminals brings about adoption of location information services as basic functions, and demands for more detailed and convenient services are growing.

A sensor capable of precisely sensing a user's location is needed to check location information, and a weak magnetic field sensor, which is used as a unit for providing the location information as shown in FIG. 1, senses the earth's magnetic field to detect the user's location.

FIG. 1 schematically illustrates a conventional weak magnetic field sensor, FIG. 2a is a timing diagram of a magnetic field generated from a first magnetic core, FIG. 2b is a timing diagram of a magnetic field generated from a second magnetic core, FIG. 2c is a timing diagram of magnetic flux density at the first magnetic core, FIG. 2d is a timing diagram of magnetic flux density at the second magnetic core, and FIGS. 2e and 2f are timing diagrams of first and second induced voltages (Vind1, Vind2) induced to a detection coil, and the total of the first and second induced voltages (Vind1+Vind2), respectively.

As shown in FIG. 1, the conventional weak magnetic field sensor includes first and second magnetic cores 1a, 1b having a shape of a large bar, excitation coils 2a, 2b, which are wound around the first and second magnetic cores 1a, 1b in a predetermined direction at regular intervals so that the wound excitation coils 2a, 2b form a figure—8 pattern to excite a magnetic field, and detection coils 3a, 3b, which are wound around the first and second magnetic cores 1a, 1b in a predetermined direction at regular intervals to detect the magnetic field generated from the first and second magnetic cores 1a, 1b.

Referring to FIGS. 2a to 2f, in which operation of the conventional weak magnetic field sensor is illustrated, an internal magnetic field (H1) of the first magnetic core 1a caused by an excitation current of an alternating current is expressed by 'Hext (external magnetic field)+Hexc (magnetic field caused by the excitation coils)', and an internal magnetic field (H2) of the second magnetic core 1b is expressed by 'Hext-Hexc'.

Additionally, a magnetic flux density (B1) of the first magnetic core 1a is expressed by 'Bext (magnetic flux density by the external magnetic field)+Bexc (magnetic flux density by the excitation coils)', and a magnetic flux density (B2) of the second magnetic core 1b is expressed by 'Bext-Bexc'.

In other words, the internal magnetic fields (H1, H2) of the first and second magnetic cores 1a, 1b are generated in a contrary direction each other, and so are the magnetic flux densities (B1, B2).

At this time, the first and second induced voltages (Vind1, Vind2), generated from the first and second magnetic cores 1a, 1b and detected by the detection coils 3a, 3b, are shown in FIG. 2e.

Since the winding of the detection coils 3a, 3b is conducted in such a way that variations of magnetic fluxes generated from the first and second magnetic cores 1a, 1b are summed, a voltage, detected by the detection coils 3a, 3b, is measured by offsetting the first and second induced voltages (Vind1, Vind2) against each other as shown in FIG. 2f.

That is to say, the magnetic fields (Hexc), caused by the excitation coils, are axially applied to the first and second magnetic cores 1a, 1b in a direction counter to each other to be offset into 0, and the external magnetic fields (Hext) are axially applied to the first and second magnetic cores 1a, 1b in the same direction, thereby the offset of the external magnetic fields is avoided.

Accordingly, an amplitude of the external magnetic field (Hext) may be obtained by measuring an amplitude of the total of the first and second induced voltages (Vind1+Vind2).

However, the conventional weak magnetic field sensor is problematic in that it is difficult to maintain a location accuracy when the excitation coils 2a, 2b and detection coils 3a, 3b are wound around the magnetic cores 1a, 1b, and that since the coils are vulnerable to temperatures, light, and surface materials for detection, precisions of characteristic values are poor.

Further, the conventional weak magnetic field sensor has disadvantages in that since the excitation coils 2a, 2b and detection coils 3a, 3b are directly wound around the magnetic cores 1a, 1b, the coils are frequently snapped.

Another disadvantage of the conventional weak magnetic field sensor is that since its size and its power consumption are large, it cannot follow the trend of miniaturization and power reduction of electronic products.

To avoid the disadvantages of the conventional weak magnetic field sensor, U.S. Pat. Nos. 5,936,403 and 6,270,686 disclose a weak magnetic field sensor. In these patents, an amorphous core is formed by stacking amorphous boards, each having a circular conductor pattern, on opposite sides of an epoxy base board, which has a particular pattern etched thereon and the capacity for vertical conductivity, and epoxy bases, which have a coil X and a coil Y, respectively, are stacked on the top and bottom surfaces of the amorphous core.

However, the U.S. Pat. Nos. 5,936,403 and 6,270,686 are problematic in that since the epoxy base board is etched to have the circular conductor pattern, the stacking is conducted in such a way that etched portions correspond in position to each other to produce the amorphous core, and the epoxy base board, having the coils X and Y thereon, is stacked on upper and lower sides of the amorphous core, the fabricating process of the weak magnetic field sensor is complicated and its production costs are increased because the sensor has many layers.

Furthermore, U.S. Pat. Nos. 5,936,403 and 6,270,686 are disadvantageous in that since lands of the coils are clustered together inside the circular amorphous core, the number of coil windings is limited, thus reducing sensitivity in detecting a weak-magnetic field due to low coil density per unit length, thereby running counter to the trend of miniaturization of electronic products.

Korean Pat. Laid-Open Publication No. 2004-11287, which was submitted on Jul. 30, 2002 by the applicant of the present invention, suggests a printed circuit board, having biaxial magnetic field detecting elements integrated thereon, to avoid the above disadvantages. The printed circuit board comprises a first soft magnetic core having a shape of two bars or rectangular rings extended in a first axial direction; a first excitation coil wound around the first soft magnetic core, resulting in formation of a metal film; a first detection coil wound around the first soft magnetic core in such a way that the first detection coil and first excitation coil are alternatively positioned on the same plane, causing formation of a metal film; a second soft magnetic core with a shape of two bars or rectangular rings extended in a second axial direction at right angles to the first soft magnetic core; a second excitation coil wound around the second soft magnetic core, resulting in formation of a metal film; and a second detection coil wound around the first soft magnetic core in such a way that the second detection coil and second excitation coil are alternatively positioned on the same plane, leading to formation of a metal film.

However, Korean Pat. Laid-Open Publication No. 2004-11287 has disadvantages in that an interface between the soft magnetic core and an insulating layer (e.g. epoxy resin layer) is in good order after fabrication of the printed circuit board, including the biaxial magnetic field detecting elements integrated thereon, is completed, but after the printed circuit board is tested to estimate its life, delamination occurs at the interface between the soft magnetic core and insulating layer.

Additionally, Korean Pat. Laid-Open Publication No. 2004-11287 is problematic in that since stripping occurs at interfaces between a developed dry film and the surface of the soft magnetic core during the lithography process for forming the soft magnetic core and the circuit pattern, an etching solution penetrates between the dry film and the surface of the soft magnetic core during an etching process, and thus, there exists an etching deviation between the soft magnetic core and the circuit pattern (i.e. copper foil).

SUMMARY OF THE INVENTION

Therefore, the present invention has been made keeping in mind the above disadvantages occurring in the prior arts, and an object of the present invention is to provide a printed circuit board with a weak magnetic field sensor used to precisely sense a weak-magnetic field, such as the earth's magnetic field, and a method of fabricating the same.

Another object of the present invention is to provide a printed circuit board with a weak magnetic field sensor capable of being highly integrated to be made useful to miniaturize electronic products and to reduce power of the electronic products, and a method of fabricating the same.

A further object of the present invention is to provide a printed circuit board with a weak magnetic field sensor, employed to improve adhesion strength between a soft magnetic core and an insulating layer, and between the soft magnetic core and a dry film, and a method of fabricating the same.

The above objects can be accomplished by providing a printed circuit board with a weak magnetic field sensor, which includes a substrate having first excitation circuits and first detection circuits formed on both sides thereof. First laminates are layered on both sides of the substrate and have soft magnetic cores with a predetermined shape formed thereon. Second laminates are layered on the first laminates and have second excitation circuits and second detection circuits, connected through via holes to the first excitation circuits and first detection circuits, respectively, so that the first and second excitation circuits and first and second detection circuits seem to be wound around the soft magnetic cores, formed thereon. At this time, the soft magnetic cores each include a magnetic core and non-magnetic metal layers formed on both sides of the magnetic core. Additionally, the soft magnetic cores, excitation circuits, and detection circuits formed on one side of the substrate are perpendicular to the soft magnetic cores, excitation circuits, and detection circuits formed on the other side of the substrate, respectively.

It is preferable that each of the soft magnetic cores further includes a surface-treated layer formed on the surface of each of the non-magnetic metal layers.

Preferably, the non-magnetic metal layers are each a Cu layer.

It is preferable that the Cu layer is 5-10 μm in thickness.

It is preferable that the surface-treated layer is selected from the group consisting of $Cu_2O$ and $CuO$.

Additionally, the present invention provides a method of fabricating a printed circuit board with a weak magnetic field sensor, which comprises (A) forming x-axial first excitation circuits and first detection circuits on one side of a substrate, and y-axial first excitation circuits and first detection circuits on the other side of the substrate; (B) laminating soft magnetic core preforms including magnetic cores, non-magnetic metal layers and surface-treated layers, first insulating layers, and first copper foils on both sides of the substrate, and making x- and y-axial soft magnetic cores of the soft magnetic core preforms; and (c) laminating second insulating layers and second copper foils on both sides of the resulting substrate, on which the soft magnetic cores are formed, and forming x- and y-axial second excitation circuits and second detection circuits, connected to the x- and y-axial first excitation circuits and first detection circuits, respectively, so that the x- and y-axial first and second excitation circuits and first and second detection circuits seem to be wound around the soft magnetic cores.

The step of (B) comprises (B-1) laminating the soft magnetic core preforms including the magnetic cores, the non-magnetic metal layers and surface-treated layers, first insulating layers, and first copper foils on both sides of the substrate; (B-2) removing the surface-treated layers from the soft magnetic core preforms laminated on both sides of the substrate; (B-3) coating an etching resist on surfaces of the the soft magnetic core preforms, from which the surface-treated layers are removed, and exposing and developing the etching resist to form an etching resist pattern with a predetermined shape; (B-4) etching the the soft magnetic core preforms using the etching resist pattern to form x- and y-axial soft magnetic cores corresponding to the etching resist pattern; and (B-5) re-forming the surface-treated layers on surfaces of the x- and y-axial soft magnetic cores.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
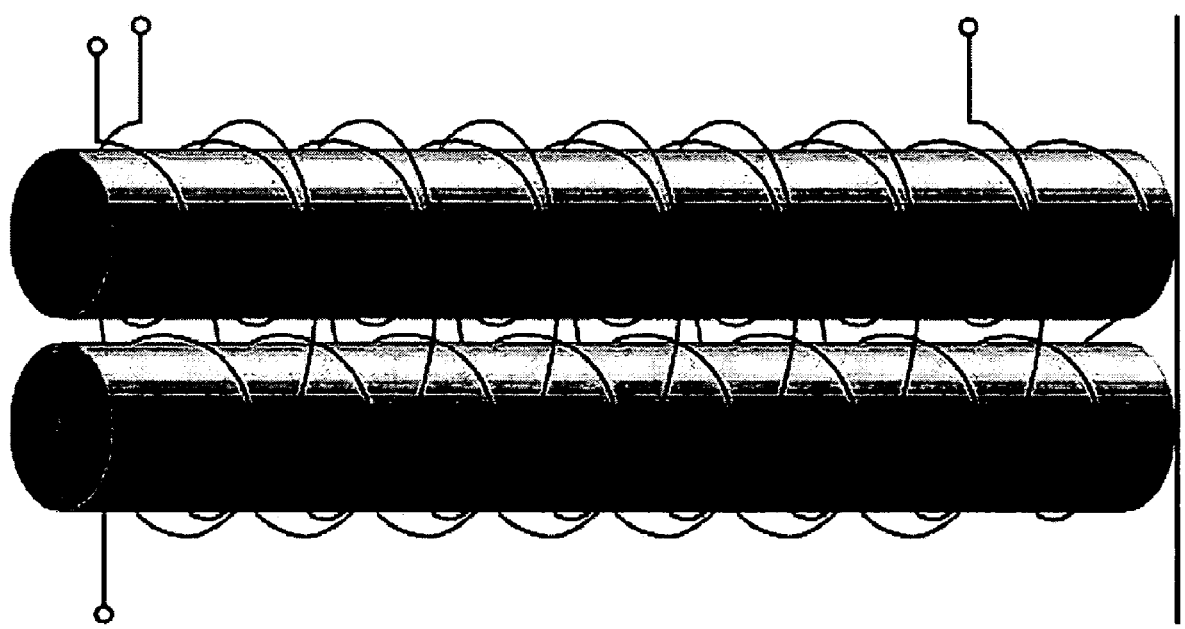
FIG. 1 schematically illustrates a conventional weak magnetic field sensor.
Figure 2A:
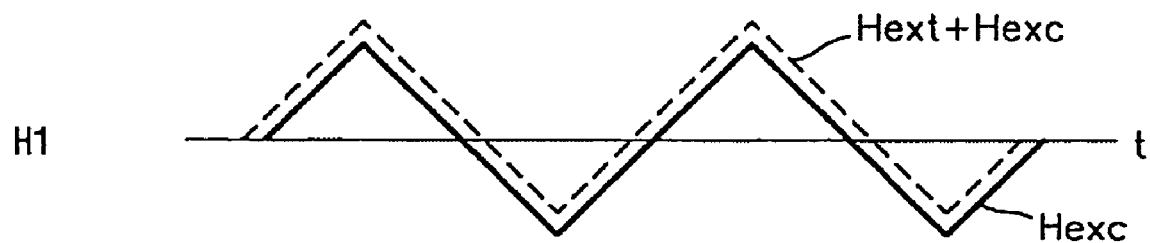
FIGS. 2*a* to 2*f* are timing diagrams illustrating an operation of the conventional weak magnetic field sensor of FIG. 1.
Figure 2B:
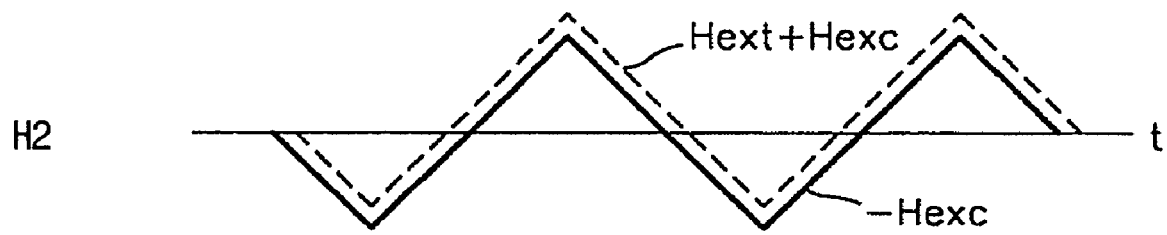
Figure 2C:
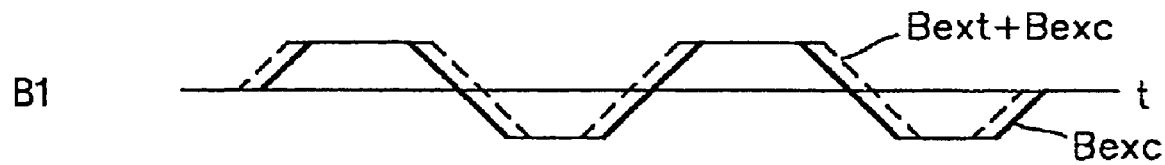
Figure 2D:
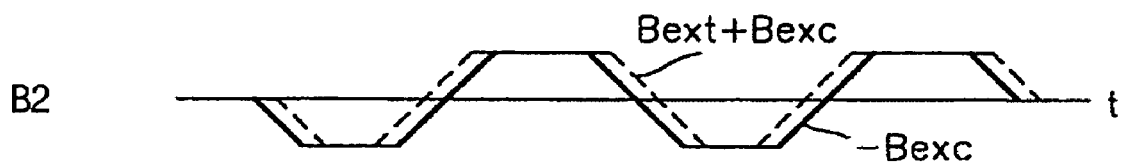
Figure 2E:
Figure 2F:

Hereinafter, a detailed description will be given of a printed circuit board with a weak magnetic field sensor and a method of fabricating the same according to the present invention, referring to the drawings.

Figure 3:
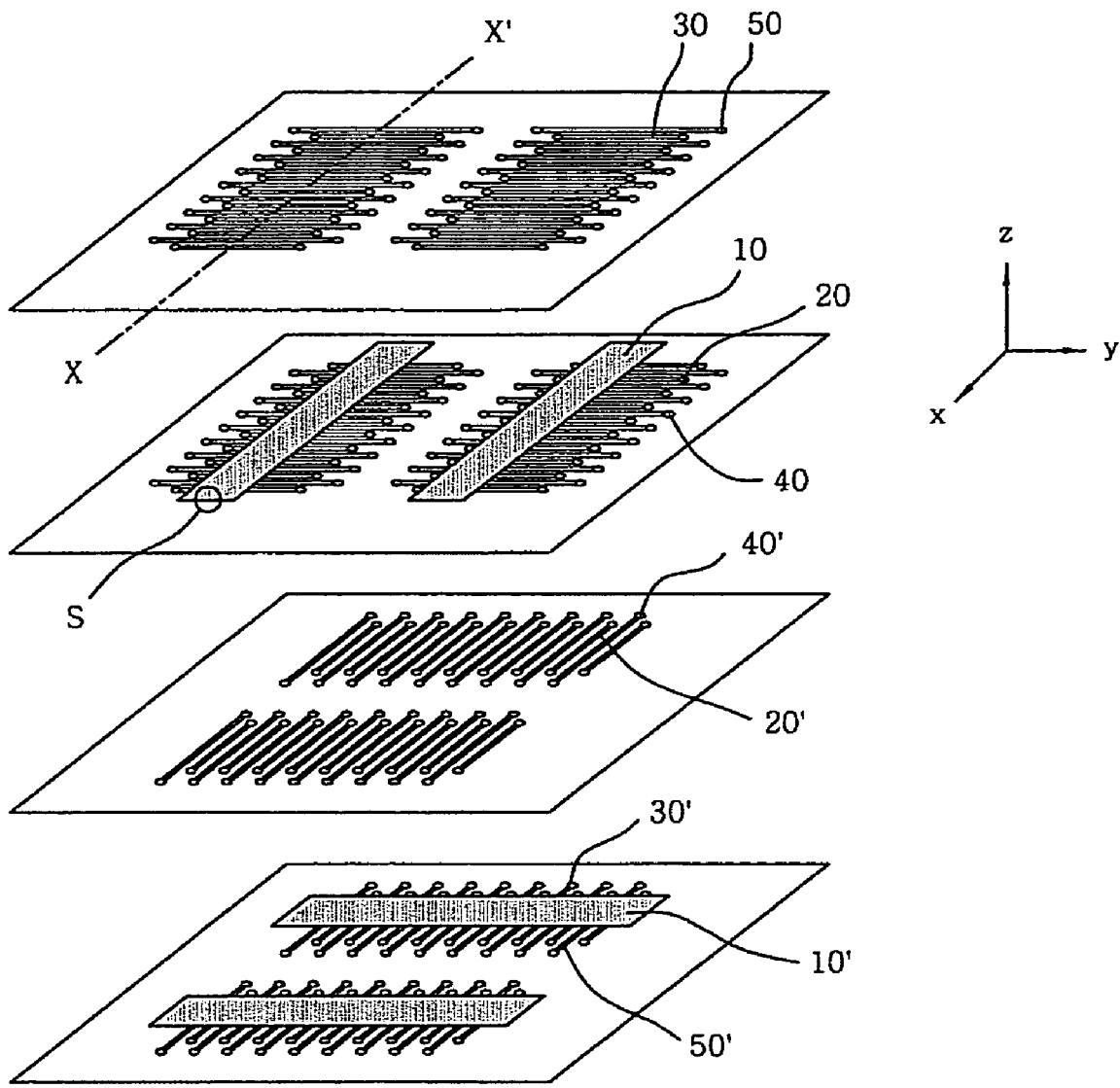
FIG. 3 is an exploded perspective view of a printed circuit board with a weak magnetic field sensor according to the present invention.
Figure 4:
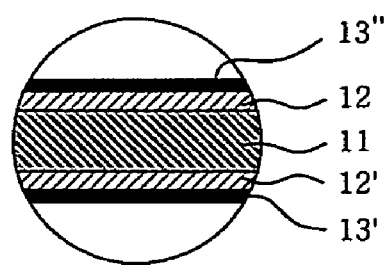
FIG. 4 is an enlarged sectional view of an S portion of a soft magnetic core of FIG. 3.

FIG. 3 is an exploded perspective view of the printed circuit board with the weak magnetic field sensor according to the present invention, and FIG. 4 is an enlarged sectional view of an S portion of a soft magnetic core of FIG. 3.

As shown in FIG. 3, the printed circuit board with the weak magnetic field sensor of the present invention descendingly and sequentially includes a first layer on which x-axial second excitation circuits 30 and x-axial second detection circuits 50 are formed, a second layer on which x-axial soft magnetic cores 10 are formed, a third layer on which x-axial first excitation circuits 20 and x-axial first detection circuits 40 are formed, a fourth layer on which y-axial first excitation circuits 20' and y-axial first detection circuits 40' are formed, a fifth layer on which y-axial soft magnetic cores 10' are formed, and a sixth layer on which y-axial second excitation circuits 30' and y-axial second detection circuits 50' are formed.

In this respect, the first to third layers are designed so as to sense an x-axial weak-magnetic field, the fourth to sixth layers are designed so as to sense a weak-magnetic field in a direction perpendicular to the x-axial direction (i.e. y-axial direction), and an x-axial weak magnetic field sensor and an y-axial weak magnetic field sensor are laminated and combined with each other.

Accordingly, the printed circuit board with the weak magnetic field sensor of the present invention can simultaneously sense the x- and y-axial weak-magnetic fields.

In the case of the x-axial weak magnetic field sensor, the x-axial second excitation circuits 30 and x-axial second detection circuits 50, and the x-axial first excitation circuits 20 and x-axial first detection circuits 40 are formed on upper and lower sides of the x-axial soft magnetic cores 10, respectively.

At this time, the x-axial second excitation circuits 30 and x-axial second detection circuits 50 on the upper sides of the x-axial soft magnetic cores 10 each have the shape of a straight line, and the straight lines are positioned at regular intervals on the same plane in such a way that the x-axial second excitation circuits 30 and x-axial second detection circuits 50 are alternately positioned. Like this, the x-axial first excitation circuits 20 and x-axial first detection circuits 40 on the lower sides of the x-axial soft magnetic cores 10 each have the shape of a straight line, and the straight lines are positioned at regular intervals on the same plane in such a way that the x-axial first excitation circuits 20 and x-axial first detection circuits 40 are alternately positioned.

In this regard, the x-axial first detection circuits 40 and x-axial first excitation circuits 20, and the x-axial second detection circuits 50 and x-axial second excitation circuits 30 may alternate in clusters of a predetermined size, but it is preferable that they alternate one by one.

Furthermore, it is preferable that the first and x-axial second detection circuits 40, 50 are longer than the first and x-axial second excitation circuits 20, 30, respectively.

In the x-axial weak magnetic field sensor of the present invention, via holes (not shown) are formed to electrically connect the x-axial first and second excitation circuits 20, 30 to each other. Like this, other via holes (not shown) are formed to electrically connect the x-axial first and second detection circuits 40, 50 to each other.

The x-axial first and second excitation circuits 20, 30 are connected in zigzag through the via holes. Additionally, the x-axial first and second excitation circuits 20, 30 are wound around the two x-axial soft magnetic cores 10 so that the x-axial first and second excitation circuits 20, 30 form a figure—8 pattern on a section taken along a yz-plane of the x-axial first and second excitation circuits 20, 30.

Similarly, the x-axial first and second detection circuits 40, 50 are connected in zigzag through the via holes. As well, the x-axial first and second detection circuits 40, 50 are wound around the two x-axial soft magnetic cores 10 so that the x-axial first and second detection circuits 40, 50 form a figure circle on a section taken along a yz-plane of the x-axial first and second detection circuits 40, 50.

The two x-axial soft magnetic cores 10 of the weak magnetic field sensor according to the present invention each have a bar or rectangular ring shape, and each include a magnetic core 11, copper clads 12, 12', and surface-treated layers 13', 13" as shown in FIG. 4.

The magnetic core 11 is selected from the group consisting of an amorphous metal, a permalloy, and a supermalloy.

The copper clads 12, 12', formed on upper and lower surfaces of the magnetic core 11, may be plated according to an electroless copper plating process or an electrolytic copper plating process, and are preferably plated according to the electrolytic copper plating process, which assures excellent physical properties. The copper clads 12, 12' each have a thickness of 5-10 μm.

The surface-treated layers 13', 13" are formed on surfaces of the copper clads 12, 12' on the magnetic core 11, and since the surface-treated layers 13', 13" each have a predetermined roughness, adhesion strength between each surface-treated layer 13', 13" and an insulating layer, such as prepreg, is improved. In order to form the surface-treated layers 13', 13", the surfaces of the copper clads 12, 12' are chemically oxidized, in detail, $Cu_2O$ (brown oxide) or $CuO$ (black oxide) is deposited on the surfaces of the copper clads 12, 12'.

A process of forming the surface-treated layers 13', 13' according to the present invention includes an acid/alkaline-defatting step of removing oxides, contaminating fats, and residual substances after stripping dry films from the surfaces of the copper clads 12, 12'; a micro-etching step of desirably roughening the surfaces of the copper clads 12, 12' to improve adhesion strength between oxide layers and the copper clads 12, 12'; a pre-dip step of previously dipping the copper-plated magnetic core 11 into a low concentration of surface treating solution to prevent the concentration of the surface treating solution from being changed and to promote an oxidation reaction; a blackening step of conducting a surface-treatment process adopting the oxidation reaction; a post-dip step of preventing damage to the oxide layers due to a reduction reaction; and a rinsing and drying step of rinsing and drying remaining chemicals.

The y-axial weak magnetic field sensor of the present invention is fabricated according to the same procedure as the case of the above x-axial weak magnetic field sensor except that the y-axial weak magnetic field sensor is designed so as to be perpendicular to the x-axial weak magnetic field sensor.

In the printed circuit board with the weak magnetic field sensor of the present invention, when an alternating current is applied to the excitation circuits 20, 20', 30, 30', magnetic flux densities of the soft magnetic cores 10, 10' are changed. Accordingly, an induced current occurs at the detection circuits 40, 40', 50, 50', initiating voltage differences. The X- and y-axial magnetic fields are sensed by detecting the voltage differences.

Figure 5A:
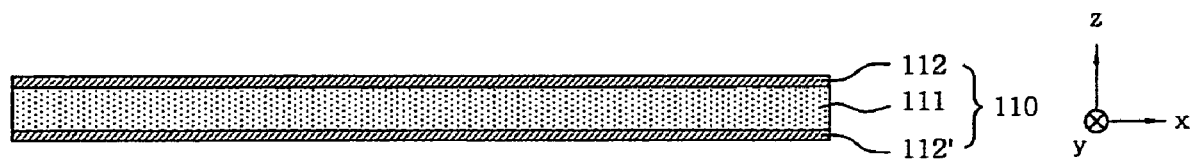
FIGS. 5*a* to 5*o* are sectional views taken along the line X-X' of FIG. 3, which show the fabrication of the printed circuit board with the weak magnetic field sensor.
Figure 5B:
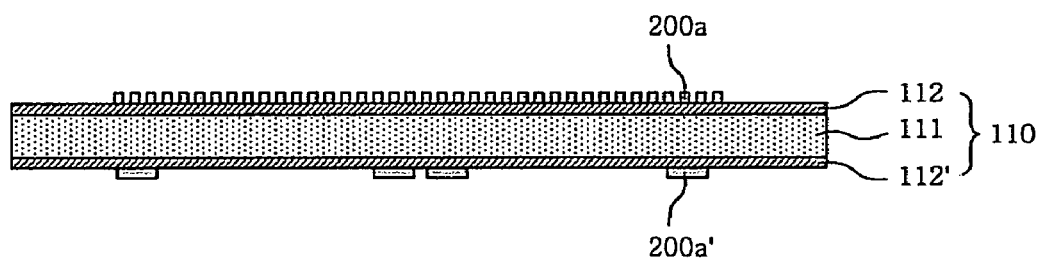
Figure 5C:
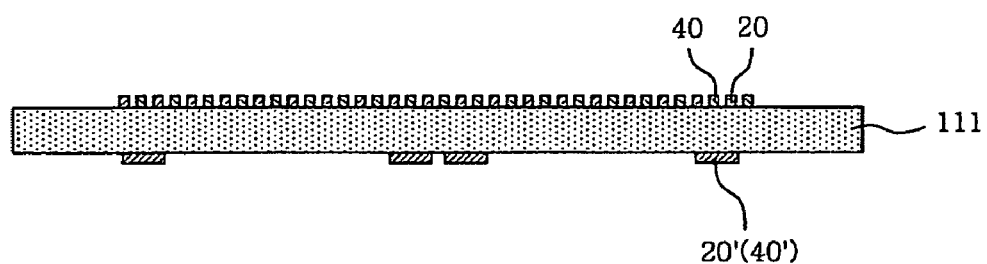
Figure 5D:
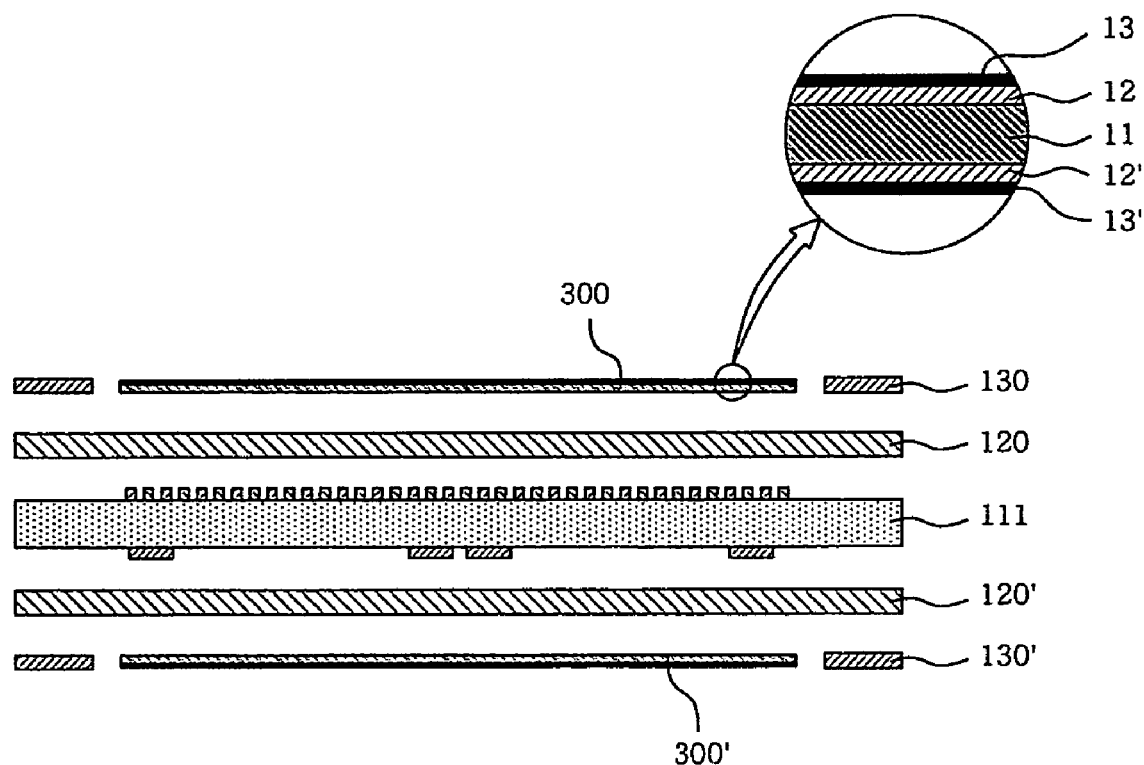
Figure 5E:
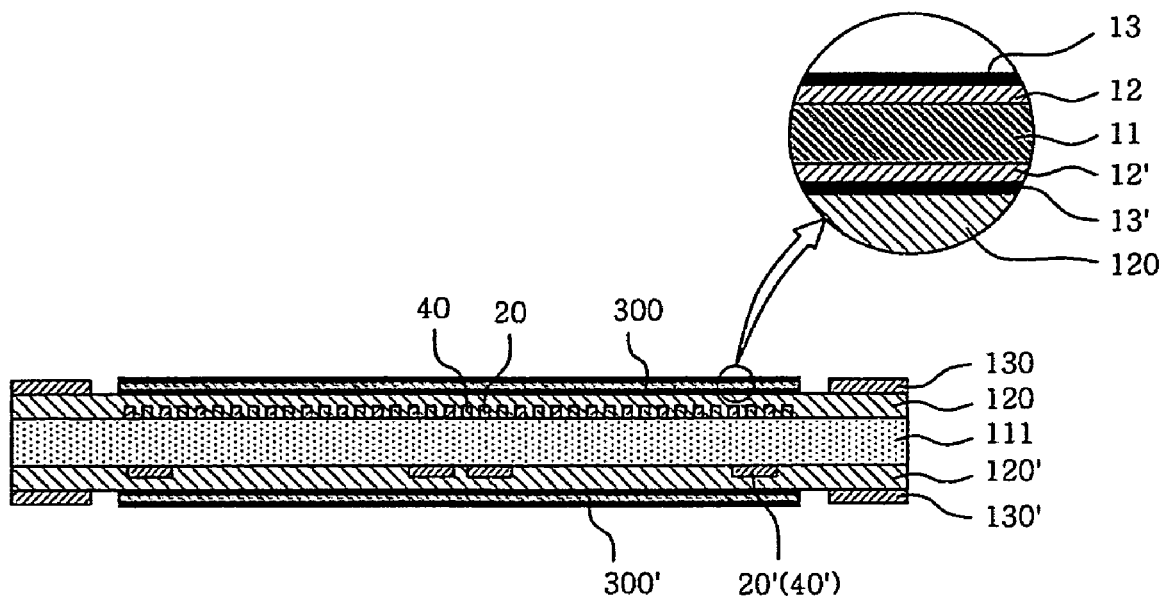
Figure 5F:
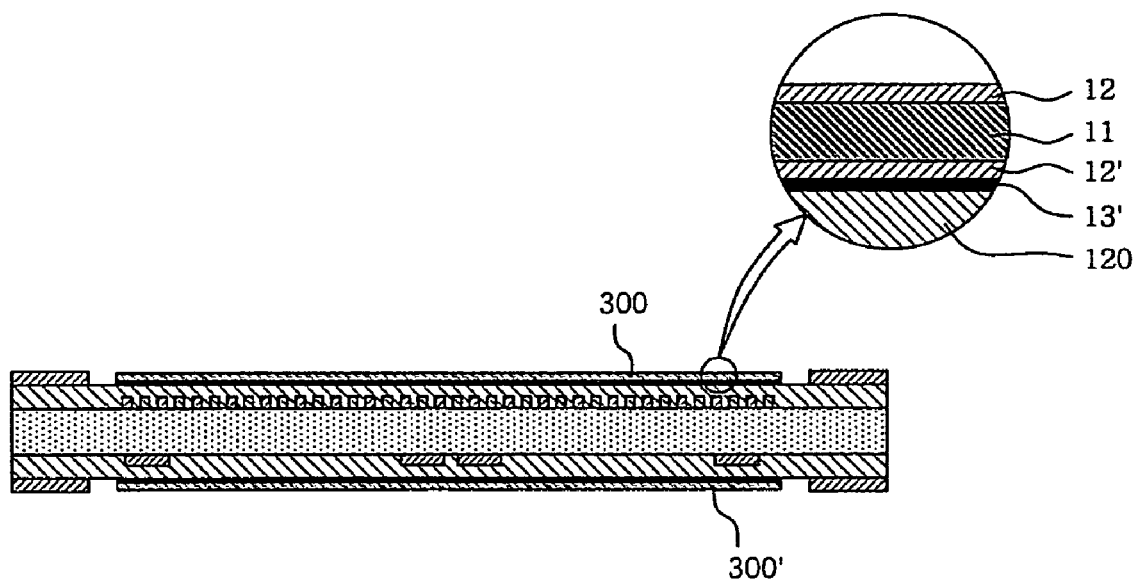
Figure 5G:
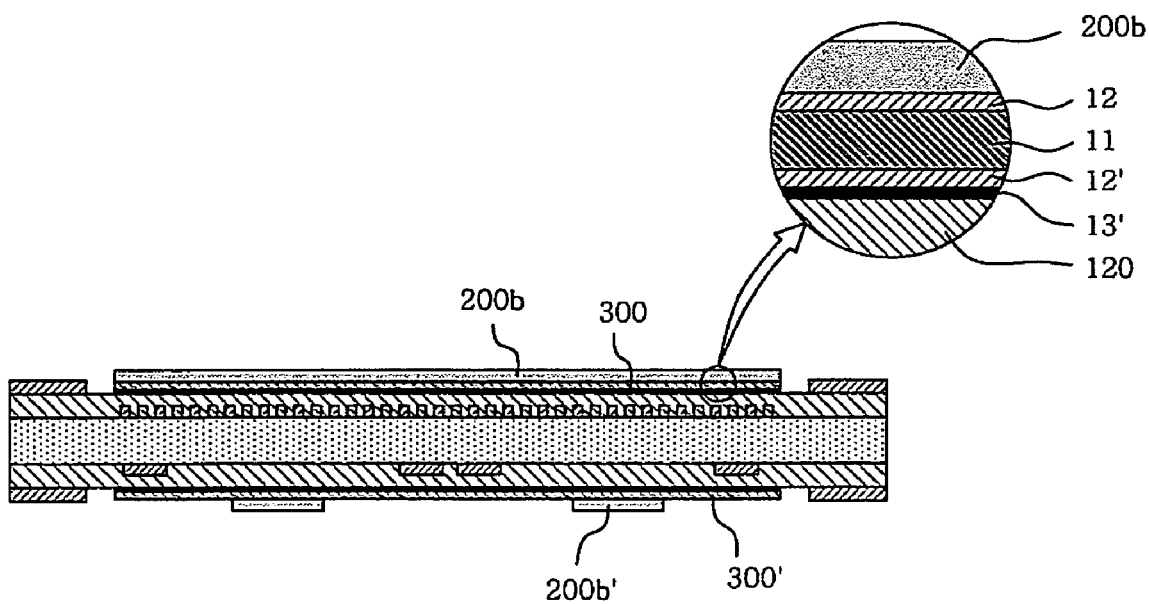
Figure 5H:
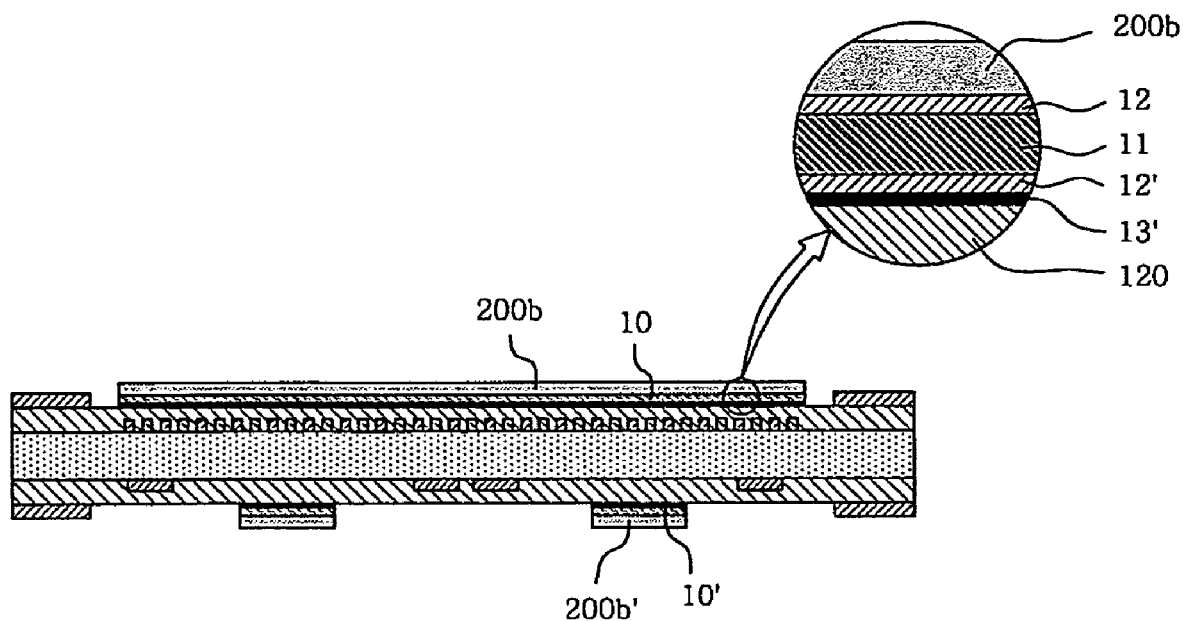
Figure 5I:
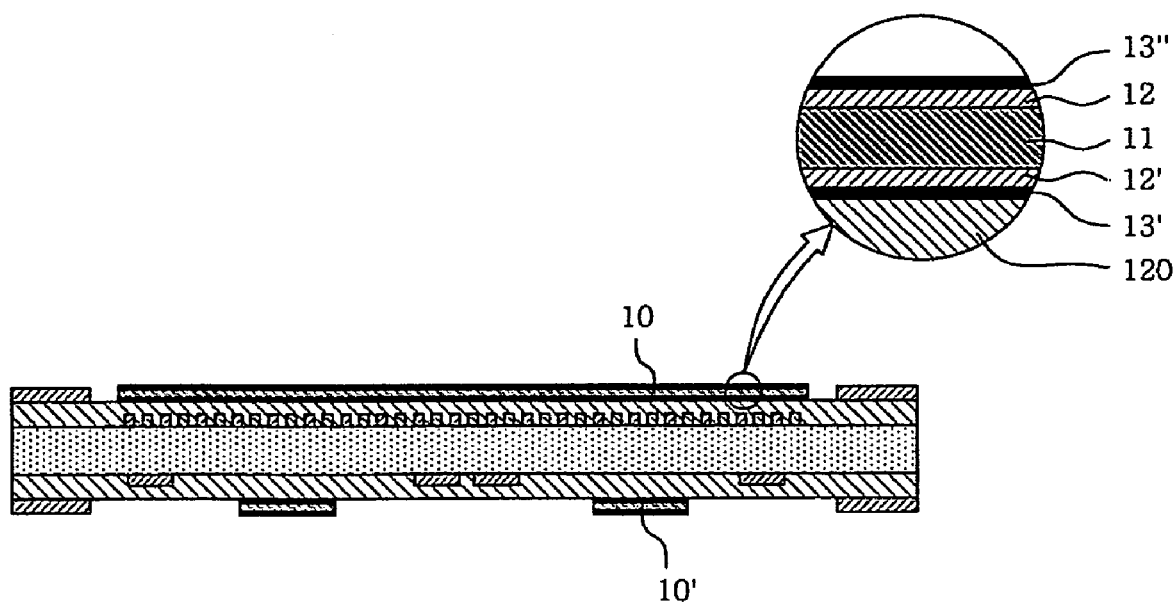
Figure 5J:
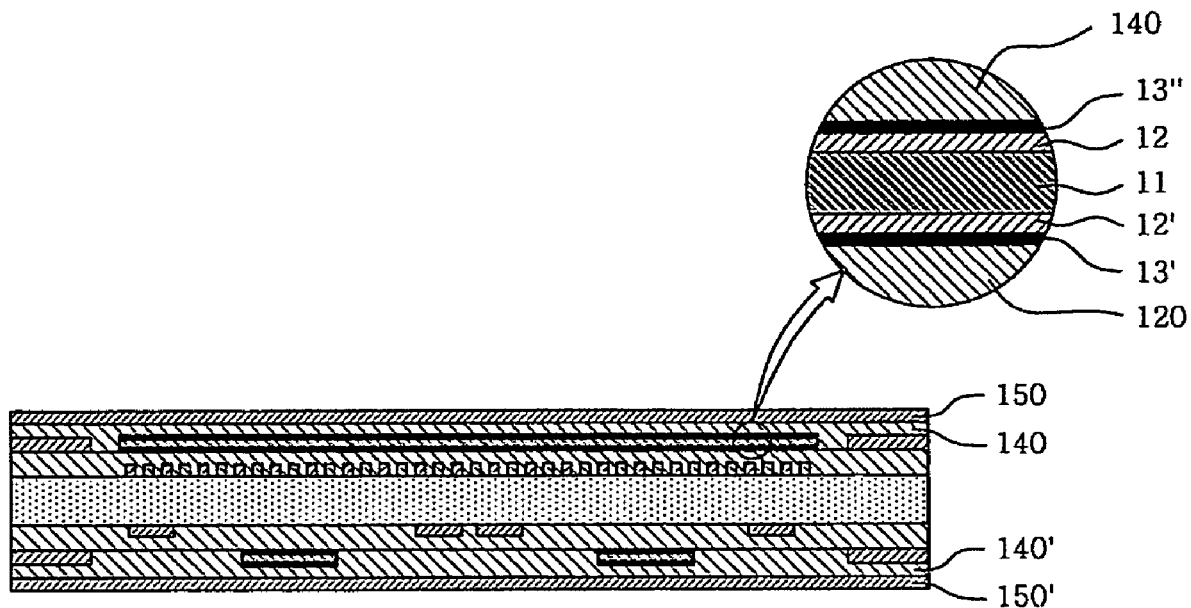
Figure 5K:
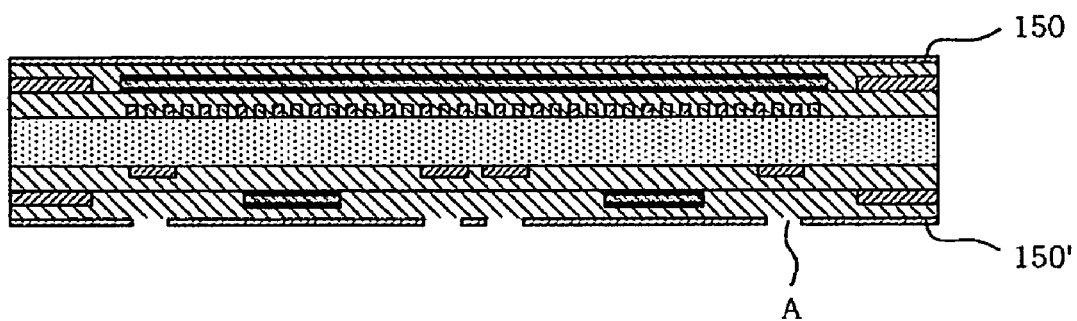
Figure 5L:
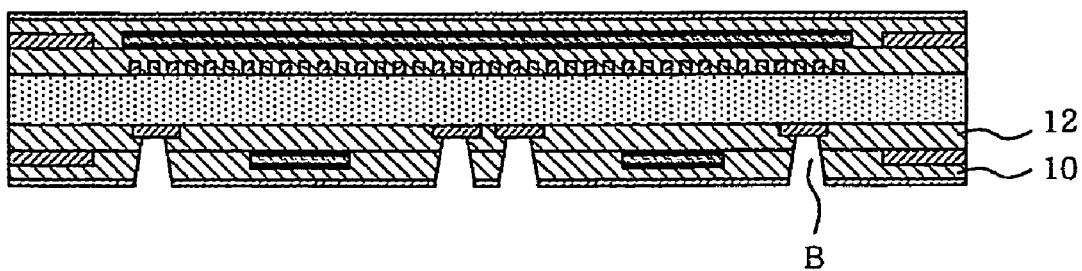
Figure 5M:
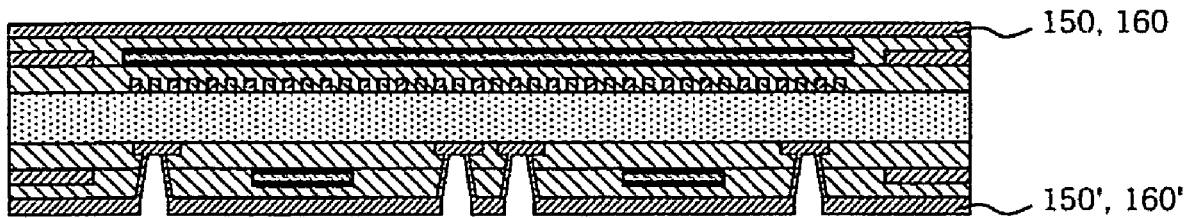
Figure 5N:
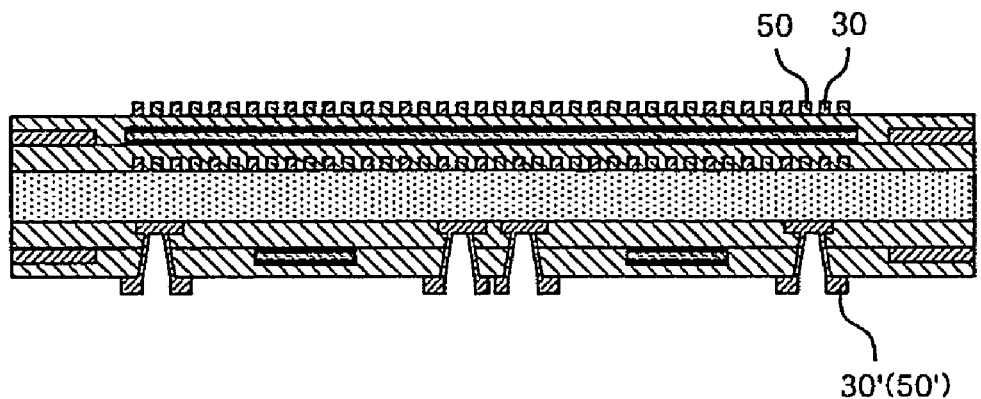
Figure 5O:
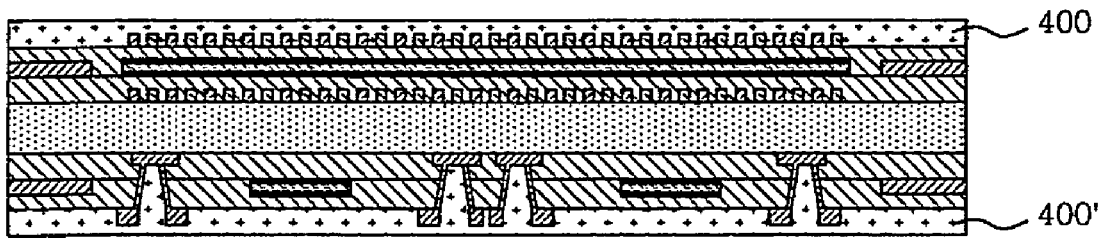

FIGS. 5a to 5o are sectional views taken along the line X-X' of FIG. 3, which show the fabrication of the printed circuit board with the weak magnetic field sensor.

Referring to FIG. 5a, a copper clad laminate is prepared as a substrate 110, in which copper foils 112, 112' are applied on an insulating resin layer 111.

The copper clad laminate 110 may be classified into a glass/epoxy copper clad laminate, a heat-resistant resin copper clad laminate, a paper/phenol copper clad laminate, a high-frequency copper clad laminate, a flexible copper clad laminate, and a composite copper clad laminate according to its application. However, it is preferable to use the glass/epoxy copper clad laminate, in which copper foils are plated on insulating resin layers, in the course of fabricating a double-sided printed circuit board and a multilayer printed circuit board.

With reference to FIG. 5b, after dry films 200a, 200a' are coated on the substrate 110, the dry films 200a, 200a' are exposed and developed using an art work film, on which a predetermined pattern is printed, to be patterned to form an etching resist pattern, having the x-axial first excitation circuits 20 and x-axial first detection circuits 40 on the upper surface of the substrate 110, and to form an etching resist pattern, having the y-axial first excitation circuits 20' and y-axial first detection circuits 40', on the lower surface of the substrate 110.

In this respect, the dry films 200a, 200a' each include three layers, that is, a cover film, a photoresist film, and a Mylar film, and the photoresist film substantially acts as a resist.

The art work film, having the predetermined pattern printed thereon, is attached to each dry film 200a, 200a', and then exposed to ultraviolet rays to achieve the exposing and developing processes of the dry films 200a, 200a'. At this time, the ultraviolet rays are not transmitted through a black portion of the art work film, on which the pattern is printed, but through a remaining portion of the art work film, on which the pattern is not printed, causing hardening of the dry films 200a, 200a' below the art work film. When the copper clad laminate, on which the partially hardened dry films 200a, 200a' are formed, is dipped into a developing solution, unhardened portions of the dry films 200a, 200a' are removed by the developing solution, and hardened portions of the dry films 200a, 200a' remain to form a resist pattern. Examples of the developing solution include a sodium carbonate ($Na_2CO_3$) aqueous solution or a potassium carbonate ($K_2CO_3$) aqueous solution.

As shown in FIG. 5c, the upper and lower copper foils 112, 112' are etched using the dry films 200a, 200a' as the etching resist to form the x-axial first excitation circuit 20 and x-axial first detection circuit 40 on the upper copper foil 112 of the substrate 110, and to form the y-axial first excitation circuit 20' and y-axial first detection circuit 40' on the lower copper foil 112' of the substrate 110.

In FIG. 5d, after the dry films 200a, 200a' are removed, first insulating layers 120, 120' (e.g. prepreg), first copper foils 130, 130', and soft magnetic laminates 300, 300' are preliminarily laid on the upper and lower surfaces of the substrate 110. At this time, portions of the first copper foils 130, 130', on which the weak magnetic field sensor is to be formed, are cut out. In this respect, the dry films 200a, 200a' are removed using a stripping solution, such as sodium hydroxide (NaOH) or potassium hydroxide (KOH).

As shown in a partially enlarged view, the soft magnetic laminates 300, 300', which are a preform of the soft magnetic core according to the present invention, each include a magnetic core 11, copper clads 12, 12' plated on both sides of the magnetic core 11, and surface-treated layers 13, 13' formed on surfaces of the copper clads 12, 12'. However, for convenience of understanding, only the magnetic core 11 and the surface-treated layers 13, 13' are illustrated in an entire sectional view.

In FIGS. 5b to 5d, the dry films 200a, 200a' are used as the etching resist, but liquid photosensitive material may be used as the etching resist. In such a case, the photosensitive material, to be exposed to the ultraviolet rays, is coated on the substrate 110, and then dried. Subsequently, the photosensitive material is exposed and developed using an art work film with a predetermined pattern to form an etching resist pattern, having the first excitation circuits 20, 20' and first detection circuits 40, 40', thereon. Successively, the upper and lower copper foils 112, 112' are etched using the patterned photosensitive material as the etching resist to form the x-axial first excitation circuits 20 and x-axial first detection circuits 40 on the upper copper foil 112 of the substrate 110, and to form the y-axial first excitation circuits 20' and y-axial first detection circuits 40' on the lower copper foil 112' of the substrate 110. Next, the photosensitive material is removed. At this time, the coating of the liquid photosensitive material may be conducted according to a dip coating process, a roll coating process, or an electro-deposition process.

As shown in FIG. 5e, the first insulating layers 120, 120', first copper foils 130, 130', and soft magnetic laminates 300, 300' are firstly laminated on the upper and lower surfaces of the substrate 110 at a predetermined temperature and pressure (e.g. about at 150-200° C. and 30-40 kg/cm$^2$). In this regard, since surfaces of the surface-treated layers 13, 13' of the soft magnetic laminates 300, 300' are rough, adhesion strength between the surface-treated layers 13, 13' and the first insulating layers 120, 120' is improved.

In FIG. 5f, the surface-treated layers 13 are removed from surfaces of the soft magnetic laminates 300, 300'. The removal of the surface-treated layers 13 may be conducted according to a wet process using an etching solution, a dry process using plasma, or a chemical process using a reduction reaction.

As shown in FIG. 5g, after the dry films 200b, 200b' are coated on the surfaces of the soft magnetic laminates 300, 300', from which the surface-treated layers 13 are removed, the dry films 200b, 200b' are exposed and developed using an art work film, having a predetermined pattern printed thereon, to form an etching resist pattern, having the x- and y-axial soft magnetic cores 10, 10', thereon.

With respect to this, since adhesion strength between the copper clads 12 of the soft magnetic laminates 300, 300' and the dry films 200b, 200b' is excellent in the present invention, an etching deviation between the soft magnetic laminates 300, 300' and the first copper foils 130, 130' with other circuit patterns, is reduced. Additionally, in the present invention, since the desired adhesion strength between the soft magnetic laminates 300, 300' and dry films 200b, 200b' is assured in the course of fabricating the printed circuit board, it is not necessary to conduct a dry process (about 150° C. for 30 min) in order to improve the adhesion strength after the exposing and developing processes.

As shown in FIG. 5h, the upper and lower soft magnetic laminates 300, 300' are etched using the dry films 200b, 200b' as the etching resist to form the x- and y-axial soft magnetic cores 10, 10' therein.

In FIG. 5i, after the dry films 200b, 200b' are removed, the surface-treated layers 13" are re-formed on surfaces of the copper clads 12 of the x- and y-axial soft magnetic cores 10, 10'.

In FIG. 5j, second insulating layers 140, 140' and second copper foils 150, 150' are secondly layered on upper and lower surfaces of the surface-treated substrate at a predetermined temperature and pressure (e.g. about at 150-200° C. and 30-40 kg/cm$^2$).

In FIG. 5k, after the second copper foils 150, 150' are subjected to a half etching process to reduce the thickness of the resulting substrate, they are exposed and developed using the dry films, and etched to form windows (A) used to form via holes.

In FIG. 5l, upper via holes (not shown) are formed using the windows (A), formed through the second copper foils 150, 150', so as to be connected through the x-axial first excitation circuits 20 and x-axial first detection circuits 40, and lower via holes (B) are formed so as to be connected through the y-axial first excitation circuits 20' and y-axial first detection circuits 40'.

In this respect, it is preferable that the upper and lower via holes (B) are formed by drilling the first and second insulating layers 140, 140' using a laser drill. Preferable examples of laser drills include a $CO_2$ laser drill. When the via holes (B) are formed using a YAG (yttrium aluminum garnet) laser drill capable of drilling the copper foils, the via holes (B) may be formed without the formation of the windows (A) through the second copper foils 150, 150' as shown in FIG. 5k.

In FIG. 5m, copper clads 160, 160' are formed on walls of the via holes (B) and second copper foils 150, 150' to electrically connect the first copper foils 130, 130', on which the first excitation circuits 20, 20' and first detection circuits 40, 40' are formed, to the second copper foils 150, 150'.

At this time, since the walls of the via holes (B) consist of insulators, it is preferable that after an electroless copper plating process is conducted, an electrolytic copper plating process is carried out, which assures excellent physical properties, thereby achieving the formation of the copper clads 160, 160'.

In FIG. 5n, the exposing, developing, and etching processes are conducted using the dry films to form the x-axial second excitation circuits 30 and second detection circuits 50 on the upper second copper foils 150 and copper clads 160, and to form the y-axial second excitation circuits 30' and second detection circuits 50' on the lower second copper foils 150' and copper clads 160'.

In FIG. 5o, solder resists 400, 400' are coated on both sides of the resulting substrate and hardened.

Subsequently, an outer profile of the printed circuit board is formed using a router or power press, thereby creating the printed circuit board with the weak magnetic field sensor according to the present invention.

With respect to this, it is preferable that the copper clads 12, 12' of the soft magnetic laminates 300, 300' each have a thickness of 5-10 μm. The thickness range is determined in consideration of thicknesses of the surface-treated layers 13, 13' of FIG. 5d, the removal of the surface-treated layers 13 conducted before the dry films 200b, 200b' of FIG. 5f adhere to the soft magnetic laminates 300, 300', and thicknesses of the re-formed surface-treated layers 13" of FIG. 5i.

Furthermore, surfaces of the copper clads 12, 12' are oxidized to deposit $Cu_2O$ or $CuO$ thereon so as to roughen the surfaces of the copper clads 12, 12', plated on the soft magnetic cores 10, 10' in the present invention, but the surfaces of the copper clads 12, 12' may be roughened according to other processes (e.g. a chemical etching process employing an etching solution).

The copper clads 12, 12' are plated on the soft magnetic cores 10, 10' in the present invention, but it is possible to use any non-magnetic metal, having excellent adhesion strength to the dry films and insulating layers. In this case, if the non-magnetic metal has the excellent adhesion strength to the insulating layers, it is not necessary to form a surface-treated layer on a non-magnetic metal layer.

In the present invention, there is described the soft magnetic cores 10, 10' having a bar shape, but use of the rectangular ring-shaped soft magnetic core is feasible. In such a case, the x-axial excitation circuits and detection circuits are formed in such a manner as to wind two different sides of upper soft magnetic cores opposite each other, and the y-axial excitation circuits and detection circuits are formed in such a manner as to wind two different sides of lower soft magnetic cores opposite each other, thereby making the weak magnetic field sensor.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, the present invention provides a printed circuit board with a weak magnetic field sensor adopted to precisely sense weak magnetic fields, such as the earth's magnetic field, and a method of fabricating the same.

Hence, the printed circuit board with the weak magnetic field sensor and the method of fabricating the same according to the present invention are useful to miniaturize electronic products and to reduce power of the electronic products because x- and y-axial weak magnetic field sensors are formed on the printed circuit board and highly integrated.

Additionally, the printed circuit board with the weak magnetic field sensor and the method of fabricating the same according to the present invention improve adhesion strength between a soft magnetic core and a dry film during an etching process because a copper clad is formed on a surface of the soft magnetic core.

Further, the printed circuit board with the weak magnetic field sensor and the method of fabricating the same according to the present invention reduce an etching deviation between the soft magnetic core and copper foil due to the improved adhesion strength between the soft magnetic core and dry film.

Furthermore, the printed circuit board with the weak magnetic field sensor and the method of fabricating the same according to the present invention contribute to reduction of a fabrication time because it is not necessary to conduct a dry process to improve the adhesion strength between the soft magnetic core and dry film after exposing and developing processes.

As well, the printed circuit board with the weak magnetic field sensor and the method of fabricating the same according to the present invention improve adhesion strength between the soft magnetic core and insulating layer because a surface-treated layer is formed on the surface of the copper clad of the copper-plated soft magnetic core.

Moreover, the printed circuit board with the weak magnetic field sensor and the method of fabricating the same according to the present invention can precisely sense weak magnetic fields in a cold climate and poor surroundings because occurrence of delamination is prevented after the printed circuit board is tested under predetermined surrounding conditions, including constant temperature and humidity conditions, due to the improved adhesion strength between the soft magnetic core and insulating layer.

What is claimed is:

1. A printed circuit board with a weak magnetic field sensor, comprising:

a substrate having a first set of first excitation circuits and first detection circuits formed on one side thereof and a second set of first excitation circuits and first detection circuits formed on the other side thereof;

wherein said sets of detection circuits are longer than sets of excitation circuits;

first laminates, which are layered over said substrate and over said sets of circuits on both sides of the substrate and including soft magnetic cores of a predetermined shape formed thereon; and second laminates, which are layered on the first laminates and have second excitation circuits and second detection circuits, connected through via holes to the first excitation circuits and first detection circuits, respectively, so that the first and second excitation circuits and first and second detection circuits are wound around the soft magnetic cores, formed thereon, the soft magnetic cores each including a magnetic core and non-magnetic metal layers formed on both sides of the magnetic core, and the soft magnetic cores, excitation circuits, and detection circuits formed on one side of the substrate being perpendicular to the soft magnetic cores, excitation circuits, and detection circuits formed on the other side of the substrate, respectively.

2. The printed circuit board as set forth in claim 1, wherein each soft magnetic core has a bar shape, and the excitation circuits and detection circuits are perpendicular to the soft magnetic cores.

3. The printed circuit board as set forth in claim 1, wherein the magnetic core is selected from a group consisting of an amorphous metal, a permalloy, and a supermalloy.

4. The printed circuit board as set forth in claim 1, wherein the non-magnetic metal layers are each a Cu layer.

5. The printed circuit board as set forth in claim 4, wherein the Cu layer is 5-10 μm in thickness.

6. The printed circuit board as set forth in claim 1, wherein each of the soft magnetic cores further comprises a surface-treated layer formed on a surface of each of the non-magnetic metal layers.

7. The printed circuit board as set forth in claim 6, wherein the non-magnetic metal layers are each a Cu layer.

8. The printed circuit board as set forth in claim 7, wherein the Cu layer is 5-10 μm in thickness.

9. The printed circuit board as set forth in claim 7, wherein the surface-treated layer is selected from the group consisting of $Cu_2O$ and $CuO$.

* * * * *